US010263605B2

(12) United States Patent
Zhang (10) Patent No.: US 10,263,605 B2
(45) Date of Patent: Apr. 16, 2019

(54) FREQUENCY EXTENDER (71) Applicant: Cemin Zhang, Diamond Bar, CA (US)

(72) Inventor: Cemin Zhang, Diamond Bar, CA (US)

(*) Notice: Subject to any disclaimer, the term of this patent is extended or adjusted under 35 U.S.C. 154(b) by 0 days.

(21) Appl. No.: 15/598,087

(22) Filed: May 17, 2017

(65) Prior Publication Data
US 2018/0145667 A1 May 24, 2018

(30) Foreign Application Priority Data
Nov. 22, 2016 (CN) .......................... 2016 1 1055980

(51) Int. Cl.
H03K 5/00 (2006.01)
H04B 1/06 (2006.01)
H04B 1/26 (2006.01)
H04B 1/40 (2015.01)
H04B 1/38 (2015.01)
H03L 7/18 (2006.01)

(52) U.S. Cl.
CPC ........... *H03K 5/00006* (2013.01); *H03L 7/18* (2013.01)

(58) Field of Classification Search
CPC ........ H03K 5/00006; H03L 7/18; H04B 1/06; H04B 1/26
USPC ........ 327/115, 116, 117, 118, 355–361, 202, 327/203, 208–212, 218; 377/47, 48; 1/1
See application file for complete search history.

(56) References Cited

U.S. PATENT DOCUMENTS

| | | | |
|---|---|---|---|
| 5,420,529 A | 5/1995 | Guay et al. | |
| 6,310,509 B1 | 10/2001 | Davenport et al. | |
| 6,385,214 B1 | 5/2002 | Kikuchi et al. | |
| 7,778,610 B2 * | 8/2010 | Staszewski | H03B 21/00 327/156 |
| 7,809,338 B2 * | 10/2010 | Tsfati | H03B 19/00 327/156 |
| 8,682,273 B2 * | 3/2014 | Fillatre | H04B 1/30 331/60 |

(Continued)

OTHER PUBLICATIONS

Kumari et al, "Programmable Frequency Divider Design for Multi-Ghz Phase Locked Loop (PLL) System", posted at International Journal of Electronic and Electrical Engineering, available from Internet, <URL: http://www.ripublication.com/irph/ijeee_spl/ijeeev7n9_15.pdf>, posting date Nov. 9, 2014 (6 pgs).

(Continued)

*Primary Examiner* — Brandon S Cole
(74) *Attorney, Agent, or Firm* — Michael North (57) ABSTRACT The invention discloses a frequency extender, including a preamplifier to receive a RF input signal and output a pre-amplified RF signal, a series frequency multiplier branch, a series frequency divider branch and a multiplexer. The output port of the preamplifier couples to one input port of the multiplexer. The series frequency multiplier branch and the series divider branch are coupled to receive the pre-amplified RF signal. The output port of each frequency multiplier in the series multiplier branch and/or the output port of each frequency divider in the series divider branch are coupled to the input ports of the multiplexer respectively. The multiplexer couples to receive the pre-amplified RF signal, the frequency-multiplied RF signal and the frequency-divided signal, the multiplexer selects a signal from the received signals and outputs a multiplexer output signal based on the selected signal.

14 Claims, 4 Drawing Sheets (56) References Cited

U.S. PATENT DOCUMENTS

| | | | |
|---|---|---|---|
| 8,787,859 B2 * | 7/2014 | Nakamura | H03G 3/3052 455/245.2 |
| 9,960,883 B1 * | 5/2018 | Chakraborty | H03M 13/41 |
| 2005/0227629 A1 * | 10/2005 | Ali | H03L 7/22 455/73 |
| 2007/0298750 A1 * | 12/2007 | Masuda | H03B 21/02 455/323 |
| 2008/0055014 A1 * | 3/2008 | Tsfaty | H03B 19/00 332/127 |
| 2008/0258781 A1 | 10/2008 | Song et al. | |
| 2009/0088113 A1 * | 4/2009 | Marsili | H04B 1/7136 455/260 |

OTHER PUBLICATIONS

Product: HMC862ALP3E. Available from Internet, <URL: http://www.analog.com/en/products/rf-microwave/frequency-dividers-multipliersdetectors/frequency-dividers-prescalers-counters/HMC862A.html#product-overview/> (4pgs).

Product: UXD20K. Available from Internet, <URL: https://www.microsemi.com/existing-parts/parts/137522#resources/>.

* cited by examiner

FREQUENCY EXTENDER

CROSS-REFERENCE TO RELATED APPLICATIONS

This application claims foreign priority to Chinese Patent Application No. 201611055980.0, entitled "A Frequency Extender," naming Cemin Zhang as inventor, and filed Nov. 22, 2016, the subject matter of which is hereby incorporated herein by reference.

BACKGROUND

Field of Invention

The invention relates to frequency source technologies, in particular, to a frequency extension device.

Background of Invention

Radio Frequency (RF) or Microwave circuit applications often involve the extension of frequency coverage, that is, the need to extend the frequency to a higher frequency or to a lower frequency. Traditionally, a frequency extension device can only extend a frequency signal either to a higher frequency signal or to a lower frequency signal. In order to simultaneously extend a frequency signal both to a higher frequency signal and to a lower frequency signal, it requires a number of different devices to build a complex frequency extension system. Existing frequency extension systems usually have disadvantages of complicated circuit structure, bulky circuit size, large power consumption and high cost. Besides, existing frequency extension systems may also have issues such as serious interference between different output frequencies, difficult to switch to a different frequency spectrum, and difficult to integrate, thus making it very challenging for practical application.

DESCRIPTION OF INVENTION

It is an object of the present invention to overcome the shortcomings of the prior art and to provide a frequency extender which is simple in structure, convenient in switching, robust in anti-interference, low power consumption, low cost, small in size, easy to integrate and popularize.

The invention solves the above-mentioned problems mainly through the following technical scheme: a frequency extender comprising a preamplifier, a series frequency multiplier branch, a series frequency divider branch and a multiplexer. The output port of the preamplifier is coupled to one input port of the multiplexer; the series frequency multiplier branch comprises at least one frequency multiplier, and the series frequency divider branch comprises at least one frequency divider. The input port of the series frequency multiplier branch and the input port of the series frequency divider branch are coupled to the output port of the preamplifier; the output port of each frequency multiplier in the series frequency multiplier branch and/or the output port of each frequency divider in the series frequency divider branch are coupled to corresponding input ports of the multiplexer respectively.

When the invention is applied, an RF input signal is amplified by the preamplifier, which outputs a pre-amplified RF signal, the pre-amplified RF signal is fed to the series frequency multiplier branch, the series frequency divider branch and the multiplexer; the multiplexer selects and one of its input RF signals as basis for a multiplexer output. By incorporating with the preamplifier, the frequency extender of the present invention provides an improved sensitivity and dynamic range, an effective match with external peripheral circuitry and an enhanced driving ability to the following stages.

Further, as one embodiment of the present invention, the multiplexer comprises four input ports, the series frequency multiplier branch has one frequency multiplier, the series frequency divider branch has two frequency dividers coupled in series; the output ports of the two frequency dividers in the series frequency divider branch, the output port of the preamplifier and the output port of the frequency multiplier in the series multiplier branch are coupled to four input ports of the multiplexer respectively. Thus in this embodiment, the frequency multiplier and the frequency divider share the same multiplexer output port.

Further, as another embodiment of the present invention, the multiplexer comprises four input ports, the series frequency multiplier branch has one frequency multiplier, the series frequency divider branch has three frequency dividers coupled in series; the output ports of the three frequency dividers in the series divider branch and the output port of the preamplifier are coupled to the four input ports of the multiplexer respectively. Thus in application, the frequency extender provides a first output port for frequency-divided RF signal and a second output port for frequency-multiplied RF signal.

Further, the output port of the multiplexer is coupled to a back-end amplifier. By implementing the back-end amplifier, the frequency extender of present invention provides an effective match with external peripheral circuitry and an improved output power level.

Further, the preamplifier comprises three fan-out buffers, the output ports of the three fan-out buffers are each coupled to the input port of the first frequency multiplier in the series frequency multiplier branch, the input port of the first frequency divider in the series frequency divider branch and one input port of the multiplexer respectively.

Further, the multiplexer comprises multiple differential pairs, each differential pair comprises a bias current control circuit that switches ON or OFF a bias current flowing through a corresponding differential pair; each input port of the multiplexer couples to a corresponding differential pair, and each differential pair is provided with a multiplexer input port; the output port of the multiplexer is coupled to output ports of all differential pairs. While in use, only one differential pair is selected to have its biasing current turned on by a corresponding bias current control circuit, the multiplexer selects a RF input signal fed to the selected differential pair. It is thus convenient for the multiplexer to select a RF input signal as basis for the RF output signal. In the present invention, each differential pair has a separate bias current control circuit, which is advantageous for RF input signal isolation between different differential pairs, and prevents non-selected RF input signals from interfering with a selected RF input signal.

Further, each said differential pair comprises two NPN transistors, the output port of the preamplifier, the input and output ports of the frequency multiplier, the input and output ports of the frequency divider, and the input and output ports of the multiplexer are all differential ports having differential signal lines; the differential signal lines at each input port of the multiplexer respectively couple to base of two NPN transistors of a corresponding differential pair, the differential signal lines at the output port of the multiplexer couple to collectors of two NPN transistors of each differential pair; each of the differential signal lines at the output of the multiplexer couples to a DC voltage source via a load resistor, both emitters of two NPN transistors of each differential pair are tied together and coupled to a corresponding bias current control circuit. Thus, when the invention is implemented, an input RF differential signal at the input of the multiplexer is amplified by a differential pair of two NPN transistors, the amplified RF differential signal outputs at the differential signal lines of the multiplexer output port.

Further, each differential signal line at the output port of the multiplexer is coupled to the DC voltage source via said load resistor and an inductor. The inductor is added to boost signal gain when operation frequency gets higher.

Further, each bias current control circuit comprises a NPN transistor, a NMOS field effect transistor (FET), a biasing resistor and a DC bias voltage source; the biasing resistor couples between an emitter of the NPN transistor and a drain of the NMOS FET, a base of the NPN transistor couples to the DC bias voltage source, a collector of the NPN transistor couples to one differential pair, a source of the NMOS FET is grounded, a logic trigger input signal is fed to a gate of the NMOS FET via a resistor, the logic trigger input signal controls ON or OFF states of the bias current control circuit with a logic high or low input voltage. While the invention is implemented, a bias current control circuit is turned on when its logic trigger input is set to a high (or low) voltage level, turning ON (or OFF) a bias current through a differential pair coupled to said bias current control circuit. Thus, the invention is convenient to switch ON or OFF a bias current through a differential pair. In the embodiment of present invention, each NMOS FET couples between GND and a biasing resistor, which is beneficial to improve the isolation between a logic trigger input signal and a differential RF signal. While in use, the size of each NPN transistor and NMOS FET, and the value of each biasing resistor can be optimized for each bias current control circuit, thus each differential pair can be biased at a different current level for selection and activation. It is thus possible to provide a larger (or smaller) turned on current when the multiplexer selects a differential pair with a relatively high (or low) frequency input signal, for optimizing the overall performance of the frequency extender.

Further, the frequency extender of present invention comprises a first decoder to generate logic trigger input signals for controlling each bias current control circuit of the multiplexer, and a second decoder to generate logic control signals for controlling ON or OFF states of the frequency multiplier and the frequency divider.

To sum up, this invention has the following beneficial features: The invention discloses a frequency extender, comprising a preamplifier, a series frequency multiplier branch, a series frequency divider branch and a multiplexer, wherein the output port of the preamplifier is coupled to one input port of the multiplexer. The series frequency divider branch comprises at least one frequency divider; the output port of each frequency divider is coupled to an input port of the multiplexer respectively. The disclosed frequency extender is simple in structure, convenient in switching, robust in anti-interference and low power consumption, through integrating the frequency multiplier and the frequency divider together, the frequency extender has a reduced number of components, making it small in size and convenient to implement for many applications.

BRIEF DESCRIPTION OF THE DRAWINGS

As a part of this application, the accompanying drawings descried hereinafter are used to provide further understanding for the embodiments of the invention, and shall not constitute a restriction on said embodiments. Among the accompany drawings.

DETAILED DESCRIPTION OF PREFERRED EMBODIMENTS

The invention will now be described by the following embodiments and accompanying drawings to better elaborate its purposes as well as the advantages of its technical scheme. All the schematic implementation methods and their illustrations are only used to elaborate the invention, and shall not constitute a restriction on the invention.

Embodiment 1

Figure 1:
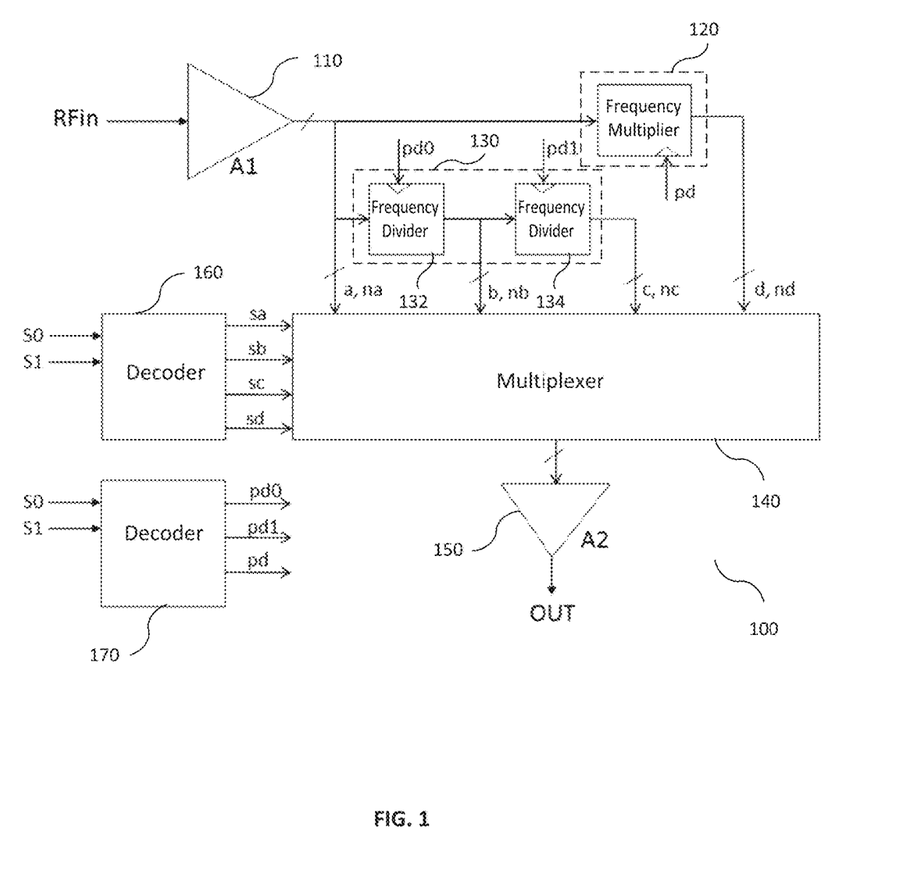
FIG. 1 is a block diagram of a first embodiment of the present invention.

As shown in FIG. 1, a frequency extender 100 comprising: a preamplifier A1 110, a series frequency multiplier branch 120, a series frequency divider branch 130, a multiplexer 140 and a back-end amplifier A2 150, wherein the multiplexer has four input ports and one output port, in this embodiment the series frequency multiplier branch comprises one frequency multiplier, the series frequency divider branch comprises two frequency dividers 132 and 134 coupled in series. The preamplifier A1 110 comprises three fan-out buffers, the output ports of the three fan-out buffers are each coupled to the input port of the frequency multiplier, the input port of the first frequency divider in the series frequency divider branch and one input port of the multiplexer 140 respectively. The output ports of the two frequency dividers in the series frequency divider branch and the output port of the frequency multiplier are coupled to the other three input ports of the multiplexer respectively, the back-end amplifier A2 150 is coupled in series with the output port of the multiplexer 140. This embodiment can be implemented on a planar monolithic substrate using silicon-based substrate materials.

Figure 2:
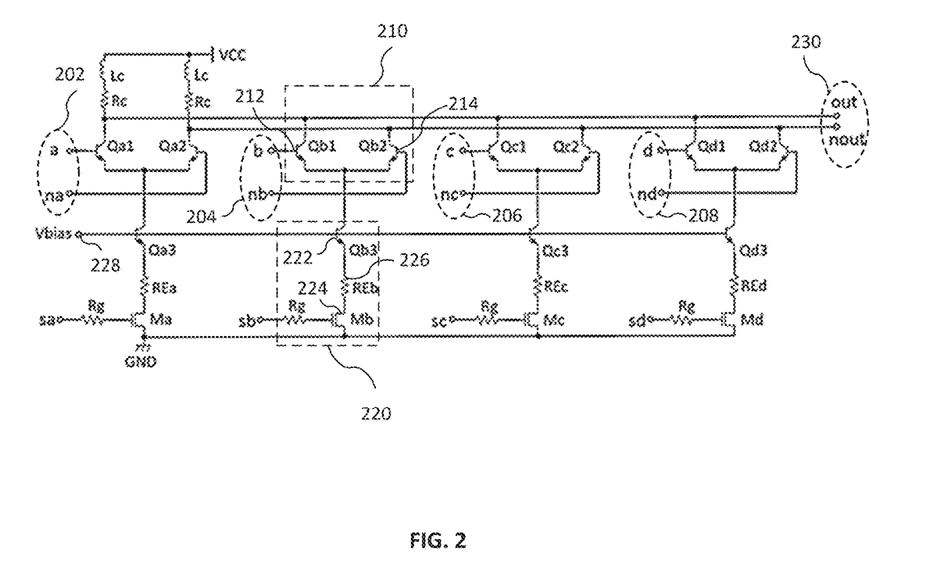
FIG. 2 is a detailed circuit schematic of the multiplexer shown in FIG. 1.

As shown in FIG. 2, in the implementation of present embodiment, the multiplexer comprises differential pairs and corresponding bias current control circuits. There are four differential pairs and each differential pair (or differential circuit) 210 couples to a bias current control circuit 220 that switches ON or OFF a bias current flowing through a corresponding differential pair. Each input port (202, 204, 206 or 208) of the multiplexer couples to a corresponding differential pair, and each differential pair is provided with a multiplexer input port; the output port 230 of the multiplexer is coupled to all differential pairs.

In this embodiment, each said differential pair (or differential circuit) 210 comprises two NPN transistors 212 and 214; the output ports of the preamplifier A1, the input and output ports of the frequency multiplier, the input and output ports of the frequency divider, and the input and output ports of the multiplexer are all differential ports having differential signal lines; the differential signal lines at each input port of the multiplexer respectively couple to bases of two NPN transistors of a corresponding differential pair, the differential signal lines, 'out' and 'nout', at the output port of the multiplexer are coupled to collectors of two NPN transistors of each differential pair; each of the differential signal lines at the output port of the multiplexer couples to a DC voltage source VCC via a load resistor Rc, both emitters of two NPN transistors of each differential pair are tied together and coupled to a corresponding bias current control circuit. In order to boost high frequency signal gain, an inductor Lc is added in series with the load resistor Rc, the inductor Lc is coupled between the load resistor Rc and the DC voltage source VCC. In the implementation of present embodiment, the output signal line 'out' of the multiplexer output port is coupled to the collectors of NPN transistors Qa1, Qb1, Qc1 and Qd1, the output signal line 'nout' of the multiplexer output port is coupled to the collectors of NPN transistors Qa2, Qb2, Qc2 and Qd2; Thus, in this embodiment each differential pair shares the same DC voltage source VCC, in addition, between all collectors of NPN transistors and the DC voltage source VCC, only two inductors Lc and two load resistors Rc are required, the total number of components are minimized.

In this embodiment, each bias current control circuit 220 comprises a NPN transistor 222, a NMOS field effect transistor (FET) 224, a biasing resistor 226 and a DC bias voltage source Vbias 228; the biasing resistor couples between an emitter of the NPN transistor and a drain of the NMOS FET, a base of the NPN transistor couples to the DC bias voltage source Vbias, a collector of the NPN transistor couples to one differential pair, a source of the NMOS FET is grounded, a logic trigger input signal is fed to a gate of the NMOS FET via a resistor Rg, the logic trigger input signal controls ON or OFF states of the bias current control circuit with a logic high or low voltage. The resistor Rg works as an isolation resistor, which helps to isolate the logic trigger signal from interfering input RF signals at differential pair, the value of Rg is set to 2 KΩ in this embodiment.

The present embodiment further comprises a first decoder 160 to generate logic trigger input signals for controlling each bias current control circuit of the multiplexer, and a second decoder 170 to generate logic control signals for controlling ON or OFF states of the frequency multiplier and the frequency divider. In the implementation of present embodiment, the first decoder is a 2-4 decoder, two input ports s0 and s1 of the 2-4 decoder are used to input logic selection signals, four output ports sa, sb, sc and sd of the 2-4 decoder couple to four logic trigger input ports of the multiplexer respectively. The second decoder generates logic control signals pd0, pd1 and pd, wherein pd0 and pd1 control the ON or OFF states of the two frequency dividers, pd controls the ON or OFF state of the frequency multiplier. In the implementation of present embodiment, an RF signal RFin (either a single-ended or a differential signal) is fed to the input port of preamplifier A1, the preamplifier A1 outputs a differential RF signal a/na, the differential RF signal a/na then drives the frequency multiplier, the first stage of the frequency divider and one input port of the multiplexer respectively; the differential RF signal a/na drives the first stage of the frequency divider and outputs a differential RF signal b/nb, the differential RF signal b/nb then drives the second stage of the frequency divider and outputs a differential RF signal c/nc; the differential RF signal a/na drives the frequency multiplier and outputs a differential RF signal d/nd. The differential RF signals a/na, b/nb, c/nc and d/nd are amplified by four differential pairs composed of NPN transistor pairs Qa1/Qa2, Qb1/Qb2, Qc1/Qc2 and Qd1/Qd2 respectively, the amplified differential RF signals then output from a differential signal line out/nout. NMOS FETs Ma, Mb, Mc and Md are NMOS switches wherein their switching ON or OFF states are determined by the logic control voltage levels from the 2-4 decoder output ports sa, sb, sc and sd; when a logic control voltage level is high (or low), a corresponding bias current control circuit is switched ON (or OFF). Four NPN transistors Qa3, Qb3, Qc3 and Qd3 are each coupled in series with biasing resistors REa, REb, REc and REd respectively, which forms four groups of independent current sources whose ON or OFF states are controlled by said NMOS switches. Thus in this embodiment, the logic control voltage levels at sa, sb, sc and sd determine which input differential RF signal at the multiplexer is selected as basis for the multiplexer output signal, which is fed to the the back-end amplifier A2 and output from the output port OUT of the back-end amplifier A2 after further amplification.

Table 1 shows the logic control truth table of the present embodiment that relates input logic control signals at input ports s0, s1 to corresponding output signals:

TABLE 1

Truth table of input logic control signals at input ports s0, s1 and the corresponding output signals

| s1 | s0 | sa | sb | sc | sd | OUT |
|----|----|----|----|----|----|-----|
| 0 | 0 | 1 | 0 | 0 | 0 | /1 selected |
| 0 | 1 | 0 | 1 | 0 | 0 | /2 selected |
| 1 | 0 | 0 | 0 | 1 | 0 | /4 selected |
| 1 | 1 | 0 | 0 | 0 | 1 | multiplier selected |

Table 2 shows the logic control truth table of the present embodiment that relates input control signals at input ports s0, s1 to the ON or OFF states of the frequency multiplier and the frequency dividers:

TABLE 2

Truth table of input logic control signals at input ports s0, s1 and the corresponding ON or OFF states of the frequency multiplier and the frequency dividers

| s1 | s0 | pd0 | pd1 | pd | OUT |
|----|----|-----|-----|----|----|
| 0 | 0 | 1 | 1 | 1 | /1 selected |
| 0 | 1 | 0 | 1 | 1 | /2 selected |
| 1 | 0 | 0 | 0 | 1 | /4 selected |
| 1 | 1 | 1 | 1 | 0 | multiplier selected |

Further, in the implementation of present invention, each differential pair conducts a different current value, for example, if the differential input RF signal a/na has the highest frequency among all differential input RF signals, the size of the NPN transistor Qa3 and the biasing resistor REa can be optimized to conduct a largest current value for the corresponding differential pair when switched ON, and therefore to improve the overall performance and power consumption for the frequency extender.

Figure 3:
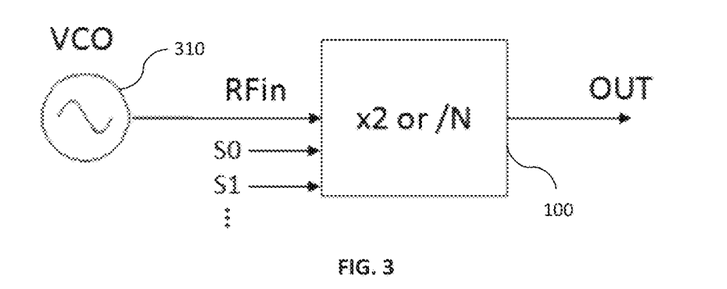
FIG. 3 shows a block diagram of the frequency extender shown in FIG. 1, working together with an external voltage controlled oscillator (VCO) to extend the frequency range of the VCO.

As shown in FIG. 3, in the implementation of present invented frequency extender, assuming the frequency divider provides /1, /2 and /4 options, the frequency multiplier provides a ×2 option, and the input RF signal RFin is produced by an external voltage controlled oscillator (VCO), if the frequency range of the VCO input signal is 5 to 10 GHz, the frequency extender output RF signal from the output port OUT can cover an extended frequency range from 1.25 to 20 GHz.

Embodiment 2

As shown in FIG. 3, in the implementation of present invented frequency extender, assuming the frequency divider provides /1, /2 and /4 options, the frequency multiplier provides a ×2 option, and the input RF signal RFin is produced by an external voltage controlled oscillator (VCO) 310, if the frequency range of the VCO input signal is 5 to 10 GHz, the frequency extender 100 output RF signal from the output port OUT can cover an extended frequency range from 1.25 to 20 GHz.

Figure 4:
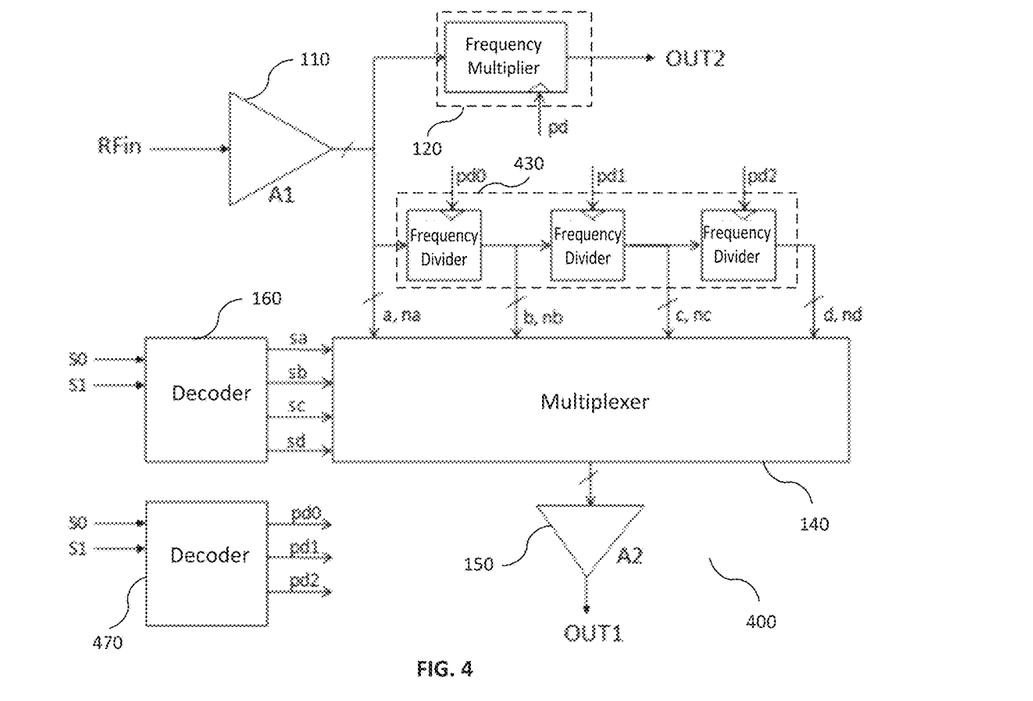
FIG. 4 is a block diagram of a second embodiment of the present invention.

As shown in FIG. 4, the difference between the present embodiment 400 and embodiment 1 100 is: in present embodiment the series frequency multiplier branch 120 has one frequency multiplier, the series frequency divider branch 430 has three frequency dividers coupled in series; the output ports of the three frequency dividers in the series frequency divider branch and the output port of the preamplifier couple to the four input ports of the multiplexer 140 respectively; the present embodiment provides a frequency-divided RF signal from an output port OUT1 and a frequency-multiplied RF signal from an output port OUT2.

The present embodiment further comprises a first decoder 160 to generate logic trigger input signals for controlling each bias current control circuit of the multiplexer, and a second decoder 470 to generate logic control signals for controlling ON or OFF states of the frequency multiplier and the frequency divider. In the implementation of present embodiment, the first decoder is a 2-4 decoder, two input ports s0 and s1 of the 2-4 decoder are used to input logic selection signals, four output ports sa, sb, sc and sd of the 2-4 decoder couple to four logic trigger input ports of the multiplexer respectively. The second decoder generates logic control signals pd0, pd1 and pd2 for controlling the ON or OFF states of the three frequency dividers. A separate logic control input signal pd controls the ON or OFF state of the frequency multiplier and determines whether or not there is an output RF signal from the frequency multiplier output port OUT2.

In the implementation of present embodiment, an RF signal RFin (either a single-ended or a differential signal) is fed to the input port of preamplifier A1, the preamplifier A1 outputs a differential RF signal a/na, the differential RF signal a/na then drives the frequency multiplier, the first stage of the frequency divider and one input port of the multiplexer respectively; the differential RF signal a/na drives the first stage of the frequency divider and outputs a differential RF signal b/nb, the differential RF signal b/nb then drives the second stage of the frequency divider and outputs a differential RF signal c/nc, the differential RF signal c/nc then drives the third stage of the frequency divider and outputs a differential RF signal d/nd. The differential RF signals a/na, b/nb, c/nc and d/nd are amplified by four differential pairs composed of NPN transistor pairs Qa1/Qa2, Qb1/Qb2, Qc1/Qc2 and Qd1/Qd2 respectively, the amplified differential RF signals then output from a differential signal line out/nout. NMOS FETs Ma, Mb, Mc and Md are NMOS switches wherein their switching ON or OFF states are determined by the logic control voltage levels from the 2-4 decoder output ports sa, sb, sc and sd; when a logic control voltage level is high (or low), a corresponding bias current control circuit is switched ON (or OFF). Thus in this embodiment, the logic control voltage levels at sa, sb, sc and sd determine which input differential RF signal at the multiplexer is selected as basis for the multiplexer output signal, which is fed to the back-end amplifier A2 and output from the output port OUT1 of the back-end amplifier A2 after further amplification.

Table 3 shows the logic control truth table of the present embodiment that relates the input logic control signals at input ports s0, s1 to corresponding output signals at output port OUT1:

TABLE 3

Truth table of input control signals at input ports s0, s1
and the corresponding output signals at output port OUT1

| s1 | s0 | sa | sb | sc | sd | OUT1 |
|---|---|---|---|---|---|---|
| 0 | 0 | 1 | 0 | 0 | 0 | /1 selected |
| 0 | 1 | 0 | 1 | 0 | 0 | /2 selected |
| 1 | 0 | 0 | 0 | 1 | 0 | /4 selected |
| 1 | 1 | 0 | 0 | 0 | 1 | /8 selected |

Table 4 shows the logic control truth table of the present embodiment that relates the input control signals at input ports s0, s1 to the ON or OFF states of the frequency dividers:

TABLE 4

Truth table of input logic control signals at input
ports s0, s1 and the corresponding ON or OFF states
of the frequency multiplier and frequency dividers

| s1 | s0 | pd0 | pd1 | pd2 | OUT1 |
|---|---|---|---|---|---|
| 0 | 0 | 1 | 1 | 1 | /1 selected |
| 0 | 1 | 0 | 1 | 1 | /2 selected |
| 1 | 0 | 0 | 0 | 1 | /4 selected |
| 1 | 1 | 0 | 0 | 0 | /8 selected |

Figure 5:
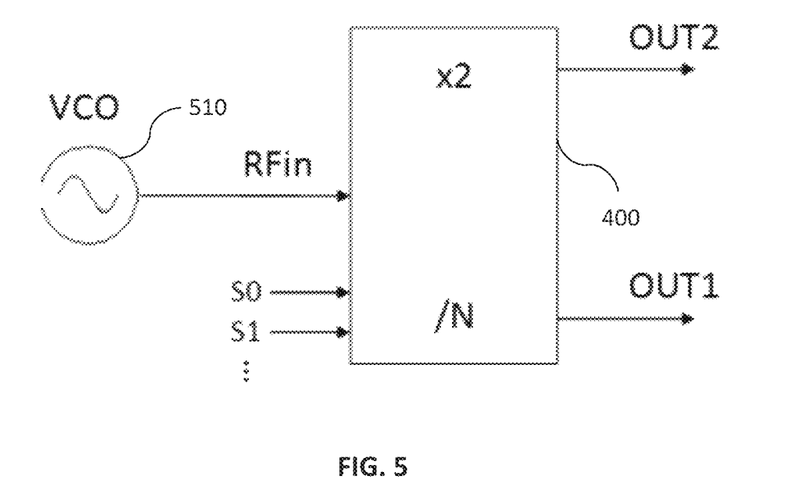
FIG. 5 shows a block diagram of the frequency extender shown in FIG. 4, working together with an external voltage controlled oscillator (VCO) to extend the frequency range of the VCO.
Figure 6:
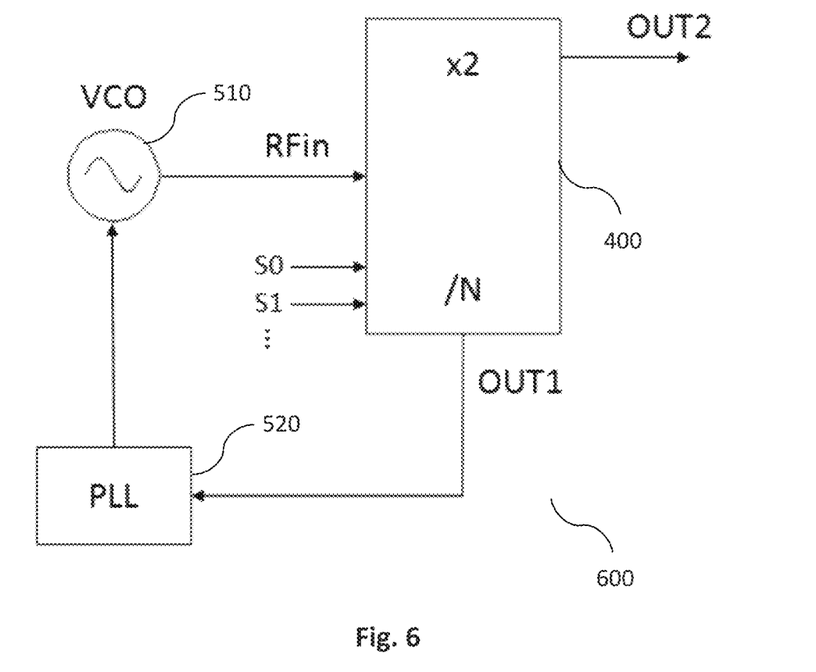
FIG. 6 shows a block diagram of the frequency extender shown in FIG. 4, working in a phase locked loop (PLL) system application.

As shown in FIG. 5, in the present embodiment of the invented frequency extender, assuming the frequency divider provides /1, /2, /4 and /8 options, the frequency multiplier provides a ×2 option, and the input RF signal RFin is produced by an external voltage controlled oscillator (VCO) 510, if the frequency range of the VCO input signal is 5 to 10 GHz, the output RF signal from the frequency multiplier output port OUT2 can cover frequency range from 10 to 20 GHz, the output RF signal from the frequency divider output port OUT1 can cover a frequency range from 0.625 to 10 GHz. FIG. 6 shows an application of the invented frequency extender in the present embodiment implemented in a phase locked loop (PLL) system 600 comprising a frequency extender 400, a VCO 510 and a PLL circuit 520, assuming an input RF signal from a voltage controlled oscillator (VCO) 510 with a frequency range from 5 to 10 GHz, the output port OUT2 of the frequency extender produces a phase locked RF signal covering a frequency range from 10 to 20 GHz.

The above said detailed descriptions of the preferred embodiments have further elaborated the purposes, technical scheme and beneficial effects of the invention. It should be understood that, all the above said are only the detailed descriptions of the preferred embodiments of the invention, and shall not constitute a restriction on the protection scope of the invention. Any amendments, substitutions to the same object and improvements that are within the spirits and principles of the invention shall fall within the protection scope of the invention.

The invention claimed is:

1. A frequency extender comprising:
   a preamplifier that receives a radio frequency (RF) input signal having an input frequency and that outputs a pre-amplified RF signal;
   a series frequency multiplier branch comprising at least one frequency multiplier coupled to receive the pre-amplified RF signal to obtain at least one frequency-multiplied RF output signal;
   a series frequency divider branch comprising at least one frequency divider coupled to receive the pre-amplified RF signal to obtain at least one frequency-divided RF output signal; and
   a multiplexer coupled to receive the pre-amplified RF signal, the at least one frequency-multiplied RF signal and the at least one frequency-divided RF signal, the multiplexer selects a signal from the pre-amplified RF signal, the at least one frequency-multiplied RF output signal, and the at least one frequency-divided RF output signal and outputs a multiplexer output signal based on the selected signal;
   wherein the multiplexer comprises multiple differential circuits coupled to receive the pre-amplified RF signal, the at least one frequency-multiplied RF signal and the at least one frequency-divided RF signal respectively via corresponding input ports, each differential circuit couples to a corresponding bias current source control circuit that switches ON or OFF a bias current flowing through the differential circuit, each input port of the multiplexer couples to a differential circuit, the multiplexer outputs the multiplexer output signal via an output port that couples to all differential circuits.

2. The frequency extender of claim 1, wherein the multiplexer comprises four input ports, the series frequency multiplier branch has one frequency multiplier and outputs one frequency-multiplied RF output signal, the series frequency divider branch has two frequency dividers coupled in series and outputs two frequency-multiplied RF output signals from the two frequency dividers respectively, the pre-amplified RF signal, the one frequency-multiplied RF output signal and the two frequency-multiplied RF output signals are fed to the four input ports of the multiplexer respectively.

3. The frequency extender of claim 1, wherein the output of the multiplexer is coupled to a back-end amplifier.

4. The frequency extender of claim 1, wherein the pre-amplifier comprises three fan-out buffers outputting the pre-amplified RF signal to the series frequency multiplier branch, the series frequency divider branch and the multiplexer respectively.

5. The frequency extender of claim 1, wherein each differential circuit comprises two NPN transistors, the input and output ports of the frequency multiplier, the input and output ports of the frequency divider, and the input and output ports of the multiplexer are all differential ports having two differential signal lines; the differential signal lines at each input port of the multiplexer respectively couple to bases of two NPN transistors of a corresponding differential circuit, the differential signal lines at the output port of the multiplexer couples to collectors of two NPN transistors of each differential circuit; each of the differential signal lines at the output port of the multiplexer couples to a DC voltage source via a load resistor, both emitters of two NPN transistors of each differential circuit are tied together and coupled to a corresponding bias current control circuit.

6. The frequency extender of claim 5, wherein each differential signal line at the output port of the multiplexer couples to the DC voltage source via the load resistor and an inductor.

7. The frequency extender of claim 1, wherein each bias current control circuit comprises a NPN transistor and a NMOS field effect transistor (FET), the NPN transistor has a base coupled to a DC bias voltage source, a collector coupled to a corresponding differential circuit, and an emitter coupled to a drain of the NMOS FET via a biasing resistor, the NMOS FET has a source grounded and a gate coupled to receive a logic trigger input via a resistor, the logic trigger input controls ON or OFF of the NMOS FET with a logic high voltage or a logic low voltage.

8. The frequency extender of claim 7 further comprises a first decoder to generate logic trigger input signals for controlling each bias current control circuit of the multiplexer, and a second decoder to generate logic control signals for controlling ON or OFF states of the frequency multiplier and the frequency divider.

9. A method for frequency extending comprising:
   pre-amplifying a radio frequency (RF) input signal having an input frequency to obtain a pre-amplified RF signal;
   feeding the pre-amplified RF signal to a series frequency multiplier branch to obtain at least one frequency-multiplied RF output signal;
   feeding the pre-amplified RF signal to a series frequency divider branch to obtain at least one frequency-divided RF output signal;
   inputting the pre-amplified RF signal, the at least one frequency-multiplied RF output signal, and the at least one frequency-divided RF output signal to a multiplexer; and
   outputting a RF output signal from the multiplexer, the RF output signal being generated based on a selected signal from the pre-amplified RF signal, the at least one frequency-multiplied RF output signal, and the at least one frequency-divided RF output signal, wherein the multiplexer comprises multiple differential circuits coupled to receive the pre-amplified RF signal, the at least one frequency-multiplied RF signal and the at least one frequency-divided RF signal respectively via corresponding input ports, each differential circuit couples to a corresponding bias current source control circuit that switches ON or OFF a bias current flowing through the differential circuit, each input port of the multiplexer couples to a differential circuit, the multiplexer outputs the RF output signal via an output port that couples to all differential circuits.

10. The method of claim 9 further comprising:
    amplifying the RF output signal from the multiplexer to obtain an amplified RF output signal.

11. The method of claim 9, wherein the series frequency multiplier branch comprises at least one frequency multiplier coupled in series, the series frequency divider branch comprises at least one frequency divider coupled in series.

12. The method of claim 9, wherein the pre-amplified RF signal, the at least one frequency-multiplied RF output signal, and the at least one frequency-divided RF output signal are differential signals.

13. The method of claim 12, wherein the RF output signal is generated by differential amplification of the selected signal from the pre-amplified RF signal, the at least one frequency-multiplied RF output signal, and the at least one frequency-divided RF output signal.

14. The method of claim 13, wherein the selection is based on an output from a decoder.

\* \* \* \* \*